United States Patent
Ando et al.

(10) Patent No.: US 9,449,887 B2
(45) Date of Patent: Sep. 20, 2016

(54) METHOD OF FORMING REPLACEMENT GATE PFET HAVING TIALCO LAYER FOR IMPROVED NBTI PERFORMANCE

(71) Applicant: GLOBALFOUNDRIES INC., Grand Cayman (KY)

(72) Inventors: Takashi Ando, Tuckahoe, NY (US); Balaji Kannan, Poughkeepsie, NY (US); Vijay Narayanan, New York, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 14/563,009

(22) Filed: Dec. 8, 2014

(65) Prior Publication Data

US 2016/0163814 A1    Jun. 9, 2016

(51) Int. Cl.
| | |
|---|---|
| H01L 21/8238 | (2006.01) |
| H01L 29/49 | (2006.01) |
| H01L 21/28 | (2006.01) |
| H01L 29/66 | (2006.01) |

(52) U.S. Cl.
CPC . *H01L 21/823828* (2013.01); *H01L 21/28088* (2013.01); *H01L 21/823857* (2013.01); *H01L 29/4966* (2013.01); *H01L 29/66545* (2013.01); *H01L 29/66606* (2013.01); *H01L 29/66871* (2013.01)

(58) Field of Classification Search
None
See application file for complete search history.

(56) References Cited

U.S. PATENT DOCUMENTS

| | | | |
|---|---|---|---|
| 7,075,161 B2 * | 7/2006 | Barth | G01N 33/48721 257/414 |
| 7,105,889 B2 | 9/2006 | Bojarczuk, Jr. et al. | |
| 7,242,055 B2 | 7/2007 | Bojarczuk, Jr. et al. | |
| 8,227,355 B2 | 7/2012 | Hori | |
| 8,288,237 B2 | 10/2012 | Callegari et al. | |
| 8,324,699 B2 * | 12/2012 | Ichijo | C23C 16/02 257/228 |
| 8,383,502 B2 | 2/2013 | Chen et al. | |
| 8,642,468 B2 | 2/2014 | Ganguli et al. | |
| 8,704,280 B2 | 4/2014 | Xu | |
| 8,716,118 B2 | 5/2014 | Ando et al. | |
| 2008/0237683 A1 * | 10/2008 | Min | H01L 21/02164 257/316 |
| 2010/0015790 A1 | 1/2010 | Callegari et al. | |
| 2011/0097858 A1 | 4/2011 | Doczy et al. | |
| 2013/0056836 A1 | 3/2013 | Yu et al. | |
| 2013/0087856 A1 | 4/2013 | Ortolland et al. | |
| 2013/0264680 A1 * | 10/2013 | Auciello | B32B 7/02 257/532 |
| 2013/0277748 A1 | 10/2013 | Lee et al. | |
| 2014/0187028 A1 | 7/2014 | Ando et al. | |
| 2014/0239407 A1 | 8/2014 | Manabe et al. | |
| 2014/0306250 A1 * | 10/2014 | Gardner | H01L 25/0753 257/89 |
| 2015/0041913 A1 * | 2/2015 | An | H01L 29/7856 257/369 |
| 2015/0270177 A1 * | 9/2015 | Tseng | H01L 21/823857 438/216 |

(Continued)

OTHER PUBLICATIONS

Xiang, J. et al. In "Investigation of TiAlC by Atomic Layer Deposition as N Type Work Function Metal for FinFET," ECS Journal of Solid State Science and Technology, (2015) vol. 4, No. 12. p. 441-p. 444.*

(Continued)

*Primary Examiner* — Michael Jung
(74) *Attorney, Agent, or Firm* — Thompson Hine LLP (57) ABSTRACT

A method of forming a transistor device includes forming an interfacial layer and a dielectric layer over a substrate; and forming a workfunction metal layer over the dielectric layer, the workfunction metal layer comprising a titanium-aluminum-carbon-oxygen (TiAlCO) layer.

10 Claims, 7 Drawing Sheets

(56) References Cited

U.S. PATENT DOCUMENTS

| | | | | |
|---|---|---|---|---|
| 2015/0279745 A1* | 10/2015 | Xu | ................. | H01L 21/28088 438/216 |
| 2015/0380407 A1* | 12/2015 | Ji | ..................... | H01L 27/0922 257/369 |
| 2016/0020118 A1* | 1/2016 | Park | ................. | H01L 21/3215 438/592 |

OTHER PUBLICATIONS

B. Lee, et al., "Impact of AlTaO Dielectric Capping on Device Performance and Reliability for Advanced Metal Gate/High-k PMOS Application," IEEE Transactions on Electron Devices, vol. 58, No. 9, Sep. 2011, pp. 2928-2935.

E. Cartier, et al., "Fundamental Aspects of HfO2-based High-k Metal Gate Stack Reliability and Implications on tinv-Scaling," IEEE International Electron Devices Meeting (IEDM), Dec. 2011, pp. 1-4.

List of IBM Patents or Patent Applications Treated as Related—U.S. Appl. No. 14/563,009, Dec. 8, 2014, pp. 1-2.

M. Casse, et al., "A Study of N-induced traps due to a nitrided gate in high-k/metal gate nMOSFETs and their impact on electron mobility," Solid-State Electronics, 65-66, 2011, pp. 139-145.

Ruqiang Bao, et al., "PFET Gate Stack Materials Having Improved Threshold Voltage, Mobility and NBTI Performance," U.S. Appl. No. 14/562,991, filed Dec. 8, 2014.

X. Garros, et al., "Guidelines to Improve Mobility Performances and BTI reliability of advanced High-K/Metal Gate stacks," Symposium on VLSI Technology Digest of Technical Papers, IEEE, Jun. 17-19, 2008, pp. 68-69.

Thomas, Shane; "International Search Report and Written Opinion"; International Patent Application No. PCT/US2015/063178 (Mar. 1, 2016).

* cited by examiner

METHOD OF FORMING REPLACEMENT GATE PFET HAVING TIALCO LAYER FOR IMPROVED NBTI PERFORMANCE

BACKGROUND

The present invention relates generally to semiconductor device manufacturing and, more particularly, to replacement gate PFET materials having improved negative bias temperature instability (NBTI) performance.

Field effect transistors (FETs) are widely used in the electronics industry for switching, amplification, filtering, and other tasks related to both analog and digital electrical signals. Most common among these are metal-oxide-semiconductor field-effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

Continuing trends in semiconductor device manufacturing include reduction in electrical device feature sizes (i.e., scaling), as well as improvements in device performance in terms of device switching speed and power consumption. MOS transistor performance may be improved by reducing the distance between the source and the drain regions under the gate conductor of the device, known as the gate or channel length, and by reducing the thickness of the layer of gate dielectric that is formed over the semiconductor surface. However, there are electrical and physical limitations on the extent to which the thickness of $SiO_2$ gate dielectrics can be reduced. For example, thin $SiO_2$ gate dielectrics are prone to gate tunneling leakage currents resulting from direct tunneling of electrons through the thin gate dielectric.

Scaling of the gate dielectric is a challenge in improving performance of advanced field effect transistors. In a field effect transistor employing a silicon oxide based gate dielectric, the leakage current through the gate dielectric increases exponentially with the decrease in the thickness of the gate dielectric. Such devices typically become too leaky to provide high performance at or below a thickness of about 1.1 nm for the silicon oxide gate dielectric.

Accordingly, recent MOS and CMOS transistor scaling efforts have focused on high-k dielectric materials having dielectric constants greater than that of $SiO_2$ (e.g., greater than about 3.9). High-k dielectric materials can be formed in a thicker layer than scaled $SiO_2$, and yet still produce equivalent field effect performance. The relative electrical performance of such high-k dielectric materials is often expressed in terms equivalent oxide thickness (EOT), since the high-k material layer may be thicker, while still providing the equivalent electrical effect of a much thinner layer of $SiO_2$. Because the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

SUMMARY

In one aspect, a method of forming a transistor device includes forming an interfacial layer and a dielectric layer over a substrate; and forming a workfunction metal layer over the dielectric layer, the workfunction metal layer comprising a titanium-aluminum-carbon-oxygen (TiAlCO) layer.

In another aspect, a method of forming a transistor device includes forming an interfacial layer and a dielectric layer over a portion of a substrate corresponding to a removed dummy gate structure; forming a p-type field effect transistor (PFET) workfunction metal layer over the dielectric layer, the workfunction metal layer comprising a titanium-aluminum-carbon-oxygen (TiAlCO) layer; and forming a gate metal layer over the PFET workfunction metal layer, thereby defining a gate stack.

In still another aspect, a transistor device includes an interfacial layer and a dielectric layer formed over a portion of a substrate corresponding to a removed dummy gate structure; a p-type field effect transistor (PFET) workfunction metal layer formed over the dielectric layer, the workfunction metal layer comprising a titanium-aluminum-carbon-oxygen (TiAlCO) layer; and a gate metal layer formed over the PFET workfunction metal layer, thereby defining a gate stack.

BRIEF DESCRIPTION OF THE DRAWINGS

Referring to the exemplary drawings wherein like elements are numbered alike in the several Figures:

FIGS. 1 through 5 are cross sectional views of an exemplary embodiment of a method of forming a high-k gate stack for a p-type FET (PFET) device, in which:

DETAILED DESCRIPTION

For a high performance CMOS device, the inversion capacitance-based oxide equivalent thickness, also referred to simply as "inversion thickness" ($T_{inv}$), of gate dielectrics should be scaled down below about 11 angstroms (Å) for future technologies. $T_{inv}$ measures the incremental inversion charge density per gate voltage swing. Due to inversion layer quantization and polysilicon gate depletion effects, $T_{inv}$ is thicker than EOT. As such, scaling of EOT also results in scaling of $T_{inv}$.

A replacement gate process architecture avoids the problems of work function material stability seen in a gate first architecture. Here, a dummy gate structure is used to self-align the source and drain implant and anneals, followed by stripping out the dummy gate materials and replacing them with the high-k and metal gate materials. Although this process is more complex than a gate first technique, advantages of a replacement gate flow include the use of separate PFET and NFET metals for work function optimization. In addition, the two metals are not exposed to high temperatures, simplifying material selection. Further, the polysilicon gate removal can actually be used to enhance strain techniques, thereby increasing drive currents.

Negative Bias Temperature Instability (NBTI) is a serious issue for replacement gate processes with scaled EOT, and is known to be associated with nitrogen incorporation into the $Si/SiO_2$ interface. It has been discovered that nitride metals (e.g., TiN) cause such nitrogen incorporation into the $Si/SiO_2$ interface and results in deteriorated NBTI. Currently, TiN is the most commonly used pFET workfunction setting metal in the industry and prior to the present disclosure there has been no alternative manufacturing-proven metal. NBTI is also known to exacerbate as increasing electric field across the gate oxide, and as such the increase of EOT ($T_{inv}$) substantially improves NBTI. However, this option is not preferred since the increase of EOT ($T_{inv}$) also results in performance degradation.

Referring initially to FIGS. 1 through 5, there is shown a series of cross sectional views of an exemplary embodiment of a method of forming a high-k gate stack for a p-type FET (PFET) device. It will be appreciated that although the PFET device formation is specifically illustrated, other areas including NFET devices (not specifically shown) may also be present in accordance with CMOS fabrication techniques. In addition, while the exemplary embodiments are depicted in the context of replacement gate planar FET devices, it will also be appreciated that such processes are equally applicable to replacement gate FinFET devices as well.

Figure 1:
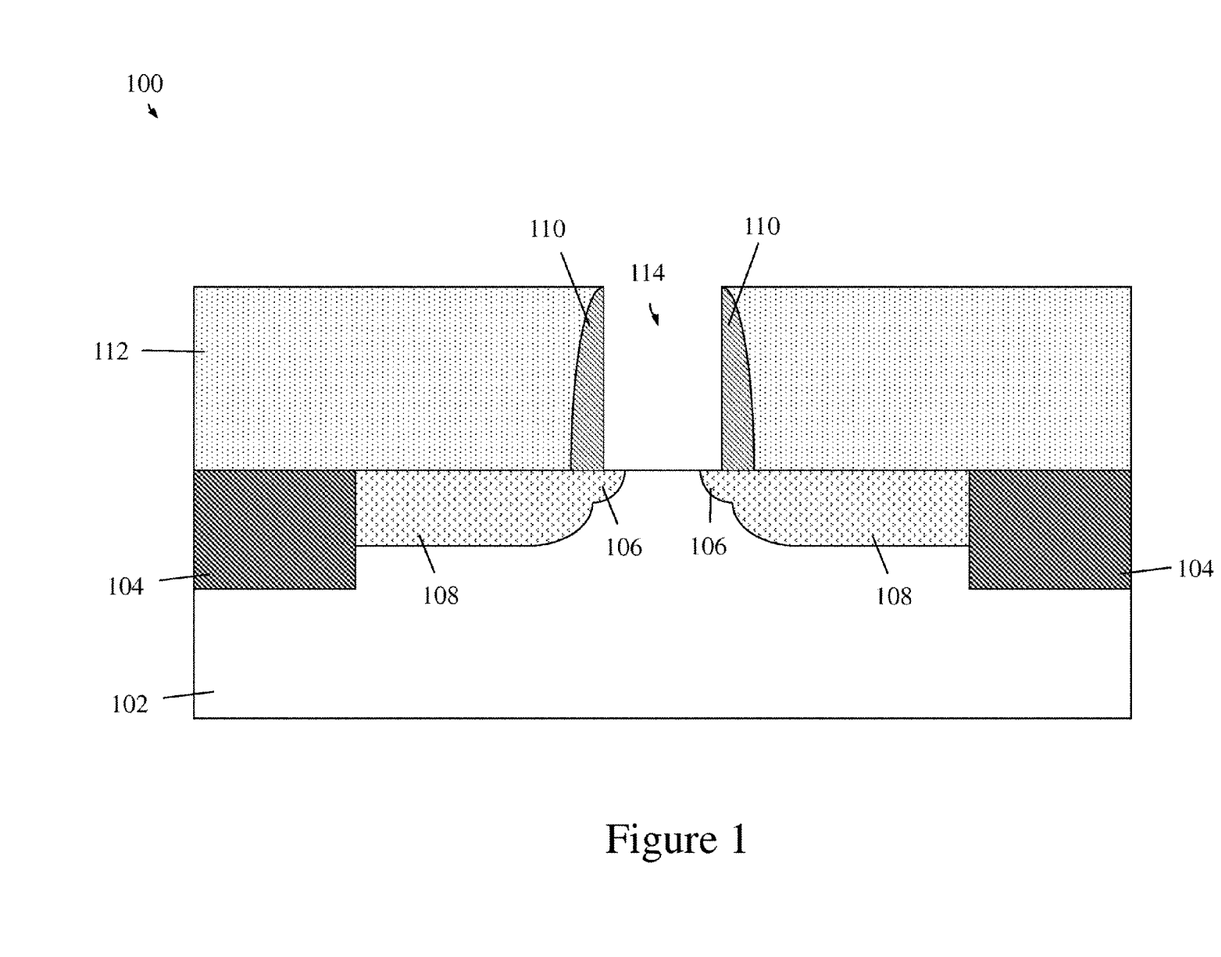
FIG. 1 illustrates the removal of a sacrificial dummy gate structure formed on a semiconductor substrate.

As shown in FIG. 1, a semiconductor structure 100 includes a semiconductor substrate 102 having shallow trench isolation structures 104 formed therein. The semiconductor substrate 102 includes a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Where the semiconductor material of the semiconductor substrate 102 is a single crystalline silicon-containing semiconductor material, the single crystalline silicon-containing semiconductor material may be selected from single crystalline silicon, a single crystalline silicon carbon alloy, a single crystalline silicon germanium alloy, and a single crystalline silicon germanium carbon alloy.

In general, the semiconductor material of the semiconductor substrate 102 may be appropriately doped either with p-type dopant atoms or with n-type dopant atoms. The dopant concentration of the semiconductor substrate 102 may range from about $1.0 \times 10^{15}$ atoms/cm³ to about $1.0 \times 10^{19}$ atoms/cm³, and more specifically from about $1.0 \times 10^{16}$ atoms/cm³ to about $3.0 \times 10^{18}$ atoms/cm³, although lesser and greater dopant concentrations are contemplated herein also. In addition, the semiconductor substrate 102 may be a bulk substrate, a semiconductor-on-insulator or silicon-on-insulator (SOI) substrate, or a hybrid substrate. The shallow trench isolation structures 104 include a dielectric material such as silicon oxide or silicon nitride, and are formed by methods well known in the art.

As also illustrated in FIG. 1, the semiconductor structure 100 is an example of replacement gate FET technology. Thus, the device includes source and drain extension regions 106 formed by ion implantation with a dummy gate structure (not shown) in place. The source and drain extension regions 106 have a doping of the opposite conductivity type of the doping of the substrate 102. For example, if the substrate 102 has a p-type doping, the source and drain extension regions 106 have an n-type doping, and vice versa. Source and drain regions 108 are also depicted in FIG. 1, which are formed, for example, by ion implantation of the same conductivity type as the extension regions 106. The source and drain regions 108 are implanted with the dummy gate structure and sidewall spacers 110 in place. The sidewall spacers 110 are formed, for example, by deposition of a conformal dielectric material layer (e.g., and oxygen-impermeable material such as silicon nitride) followed by an anisotropic ion etching. The portions of the dielectric material layer that are formed directly on the sidewalls of the dummy gate structure remain after the anisotropic etch to constitute the sidewall spacers 110.

Prior to removal of the dummy gate structure, an interlevel dielectric (ILD) layer 112 is formed over top surfaces the device. The ILD layer 112 includes a dielectric material such as silicon oxide, silicon nitride, silicon oxynitride, or a combination thereof. Alternatively, the ILD layer 112 may include a low-k dielectric material having a dielectric constant less than 3.9 (e.g., the dielectric constant of silicon oxide), and more specifically less than 2.5. Exemplary low-k dielectric materials include organosilicate glass (OSG) and SiLK®. The ILD layer 112 is planarized to expose a top surface of the dummy gate structure.

In accordance with a replacement gate process, FIG. 1 shows the dummy gate structure having been removed, such as through one or more etch processes, so as to form a recess 114 that exposes a top surface of the substrate 102 corresponding to the location of the FET channel. Hereinafter, the processing figures are described in terms of forming a replacement gate PFET device.

Figure 2:
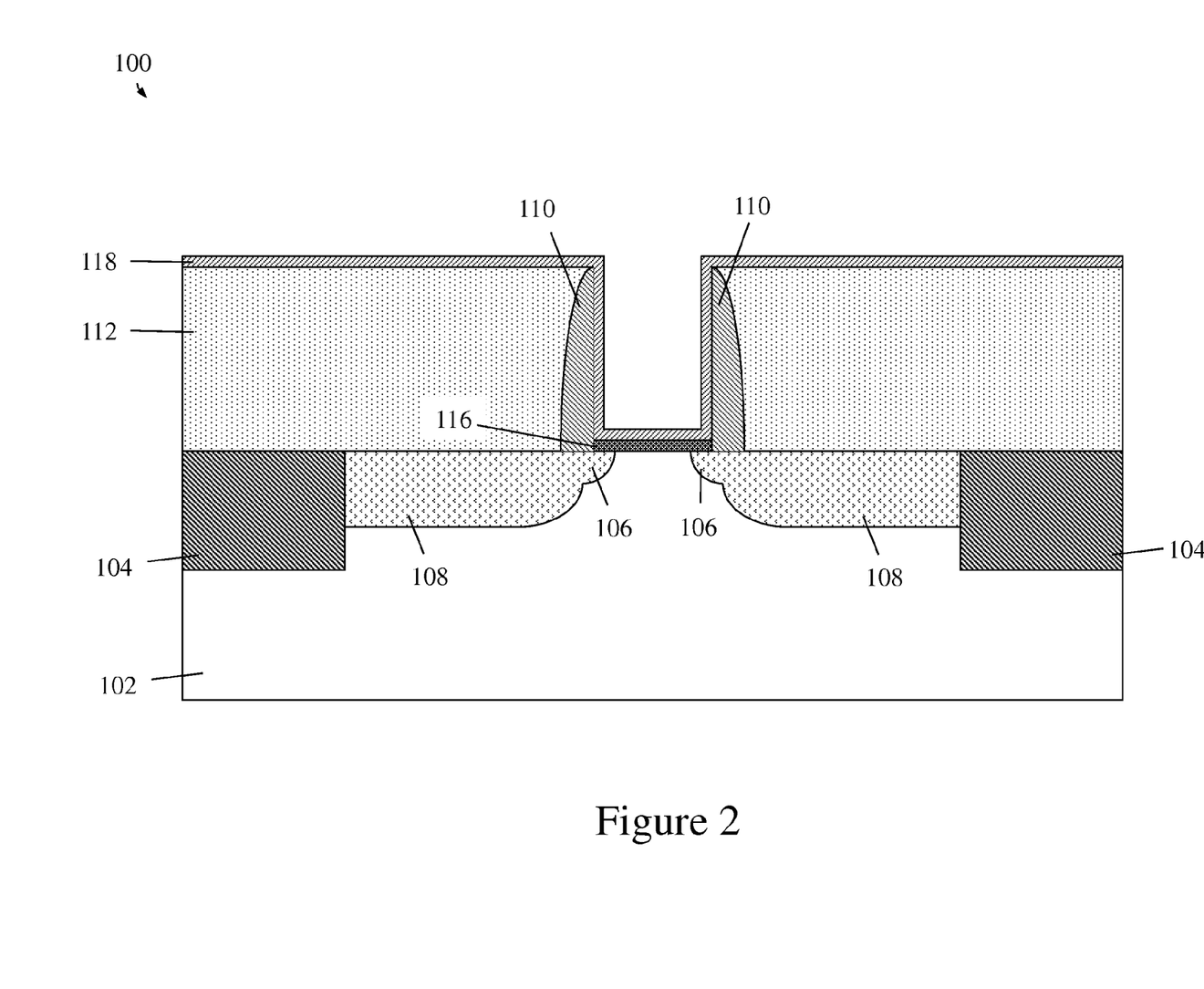
FIG. 2 illustrates the formation of an interfacial layer (IL) and high-k dielectric layer over the structure of FIG. 1.

As then shown in FIG. 2, an interfacial oxide layer (IL) 116 is formed on the exposed semiconductor surface of the substrate 102 between the gate sidewall spacers 110. In an exemplary embodiment, the IL 116 is formed by a chemical oxide process such as by a wet chemical oxidation that includes treating the cleaned semiconductor surface 102 (e.g., by hydrofluoric acid) with a mixture of ammonium hydroxide, hydrogen peroxide and water (in a 1:1:5 ratio) at 65° C. Alternatively, the chemical oxide layer can also be formed by treating the HF-last semiconductor surface in ozonated aqueous solutions, with the ozone concentration usually varying from, but not limited to: 2 parts per million (ppm) to 40 ppm. However, it will be appreciated that the IL layer 116 may be formed by other processes known in the art such as, for example, by atomic layer deposition (ALD) of $SiO_2$ or by rapid thermal anneal (RTA) in an $O_2$ or $NH_3$ ambient environment. The formation of the IL 116 allows for nucleation of a high-k dielectric layer 118 formed thereon, which includes a dielectric metal oxide having a dielectric constant that is greater than the dielectric constant (7.5) of silicon nitride.

The high-k dielectric layer 118 may be formed by methods well known in the art including, for example, chemical vapor deposition (CVD), ALD, molecular beam deposition (MBD), pulsed laser deposition (PLD), liquid source misted chemical deposition (LSMCD), etc. In an exemplary embodiment, the dielectric metal oxide of the high-k dielectric layer 118 includes a metal and oxygen, and optionally nitrogen and/or silicon. Specific examples of high-k dielectric materials include, but are not limited to: $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer 118 may be from about 1 nm to about 10 nm, and more specifically from about 1.5 nm to about 3 nm. Following the formation of the high-k dielectric layer 118, an optional anneal may be performed to densify the high-k material.

Figure 3:
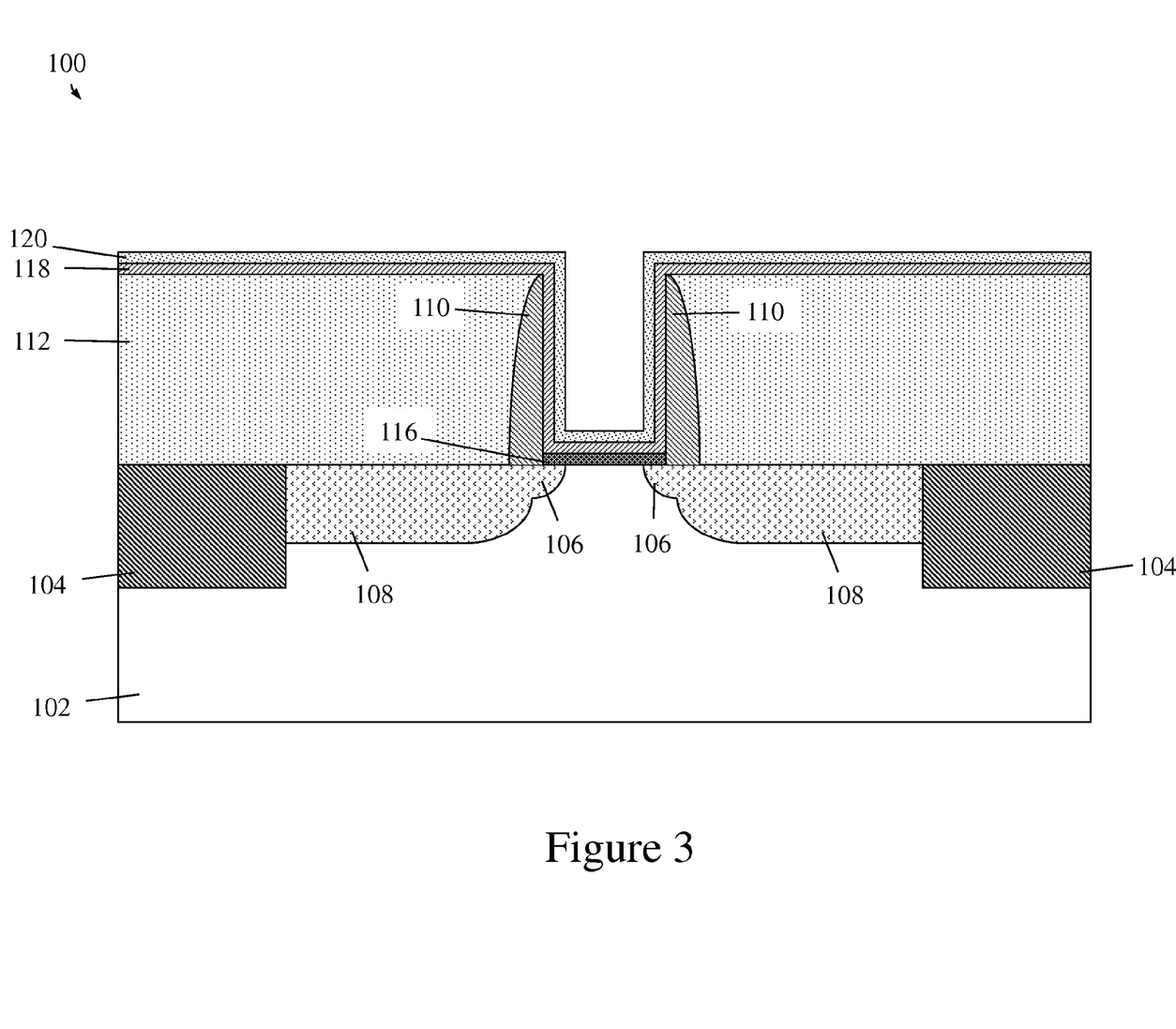
FIG. 3 illustrates the formation of a titanium-aluminum-carbon-oxygen (TiAlCO) PFET workfunction metal layer over the high-k dielectric layer of FIG. 2, resulting in improved NBTI performance.

As indicated above, the scaling of the EOT and $T_{inv}$ of the composite dielectric stack 116/118 may lead to performance issues such as NBTI in PFET devices due to the incorporation of nitrogen into the $Si/SiO_2$ interface from the conventional TiN workfunction metal. Accordingly, FIG. 3 illustrates the formation of a novel PFET workfunction metal layer 120 over the high-k dielectric layer 118. In particular, the metal layer 120 comprises a titanium-aluminum-carbon-oxygen (TiAlCO) layer having an atomic concentration range of 10-20% for Ti, 10-20% for Al, 5-15% for C, and 45-75% for O. The PFET workfunction metal layer 120 may be formed, for example, using ALD at a thickness of about 5 nanometers (nm) or less, and has a workfunction in the range of about 4.70-5.17 electron volts (eV), and more particularly about 4.9 eV.

The use of TiAlCO as a work function setting metal for PFET devices provides a solution for preventing nitrogen-induced NBTI degradation, while also selectively increasing EOT ($T_{inv}$) for PFET devices, such that NFET device performance is maintained.

Figure 4:
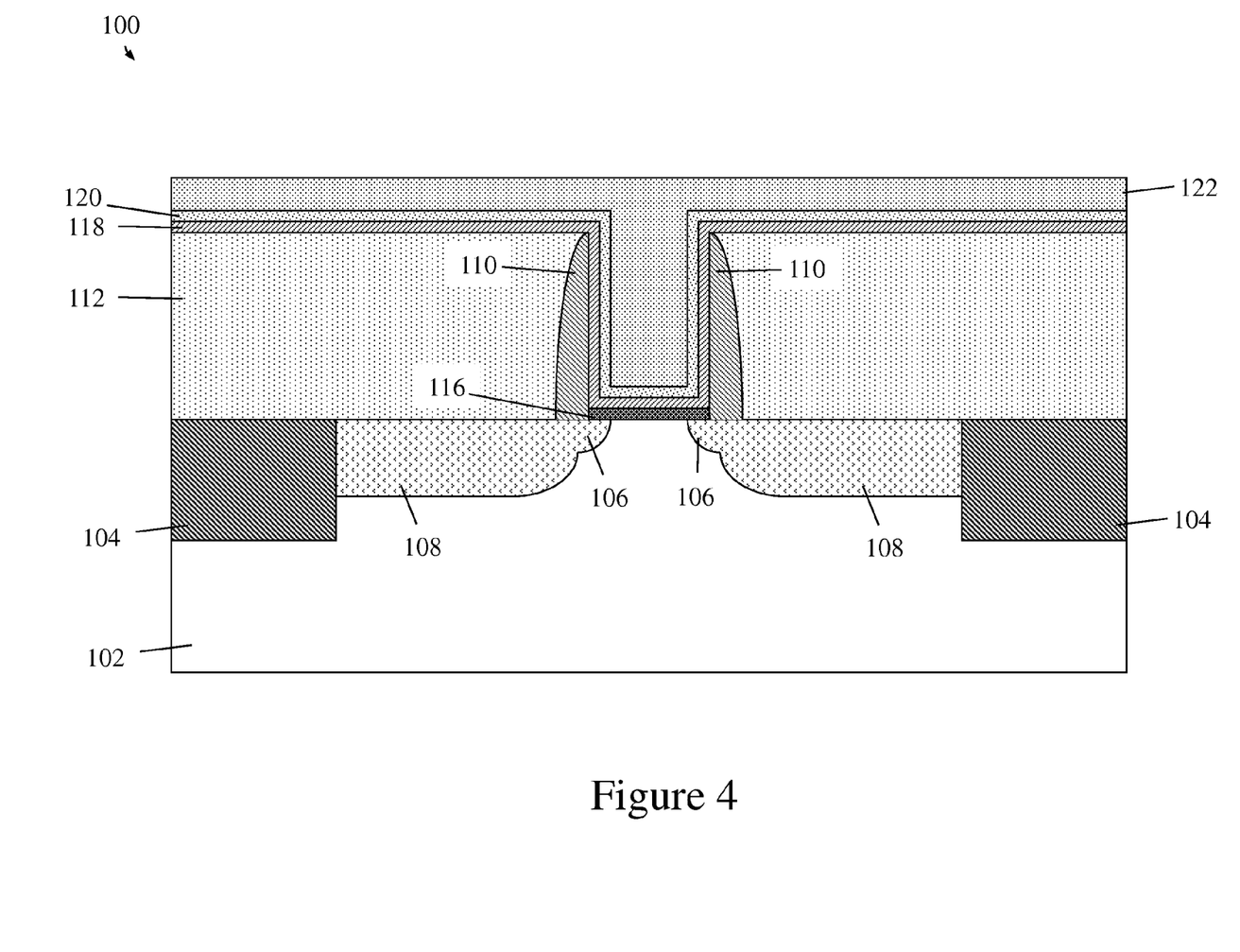
FIG. 4 illustrates the formation of one or more additional metal layers of the gate stack to define a metal gate electrode material over the structure of FIG. 3.
Figure 5:
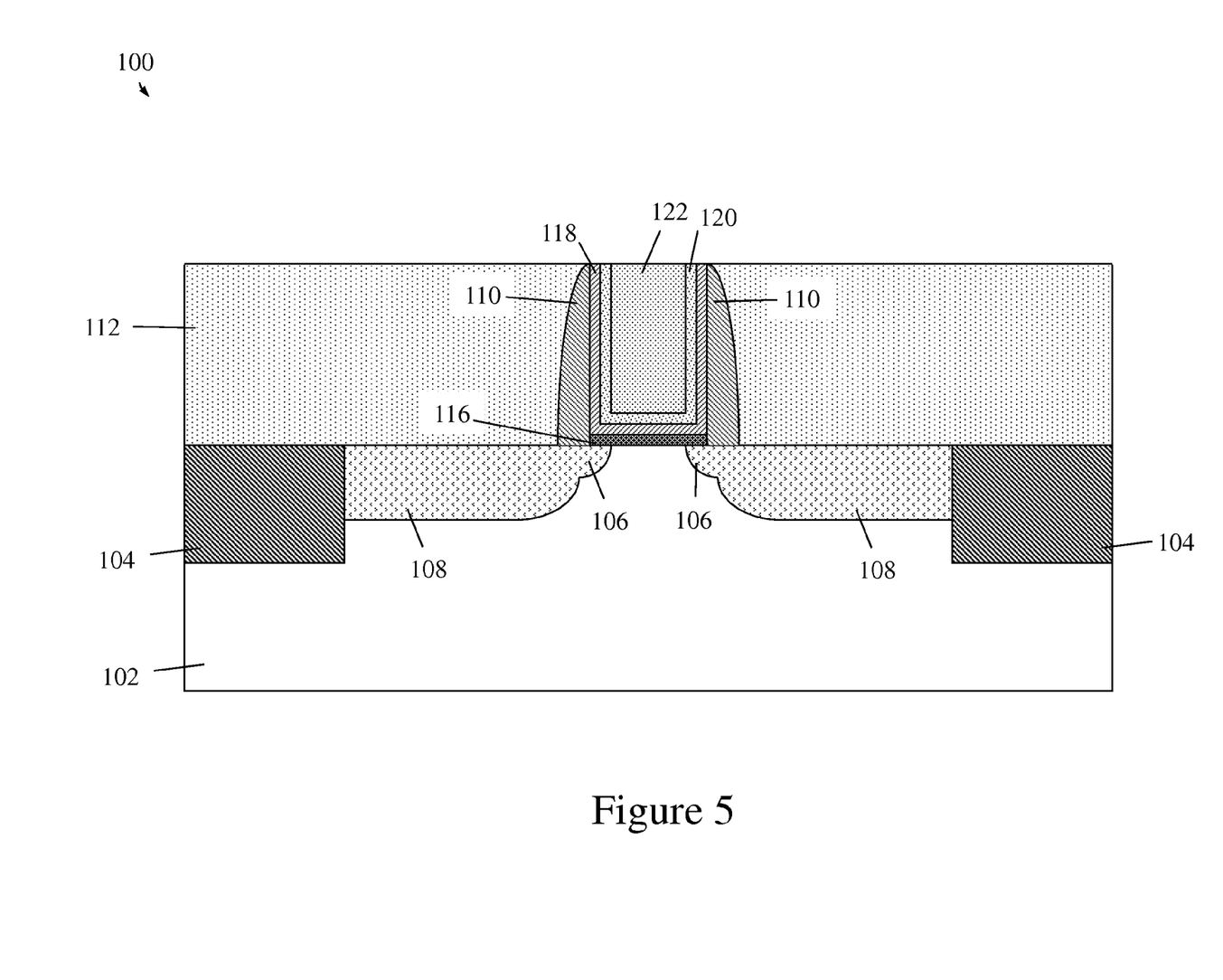
FIG. 5 illustrates planarization of the structure of FIG. 4 so as to define a high-k, metal gate transistor structure.

After formation of the TiAlCO layer 120 as a work function setting metal, one or more remaining metal layers 122 of the gate stack may then be formed, as shown in FIG. 4. The one or more metal layers may include, for example, a wetting titanium nitride deposition layer, and one or more of aluminum, titanium-doped aluminum, tungsten or copper. In FIG. 5, the structure is planarized, such as by chemical mechanical polishing (CMP) to define a gate last or gate replacement transistor device. From this point, existing processing techniques (e.g., silicide contact formation for gate, source and drain terminals, upper level wiring formation, etc.) may continue.

In the context of CMOS device processing, it is contemplated that following dummy gate removal for both PFET and NFET devices, and following interfacial layer and high-k layer formation, the TiAlCO PFET workfunction metal may be formed either before or after the NFET workfunction metal. Each embodiment is summarized in the flow diagrams of FIG. 6 and FIG. 7.

Figure 6:
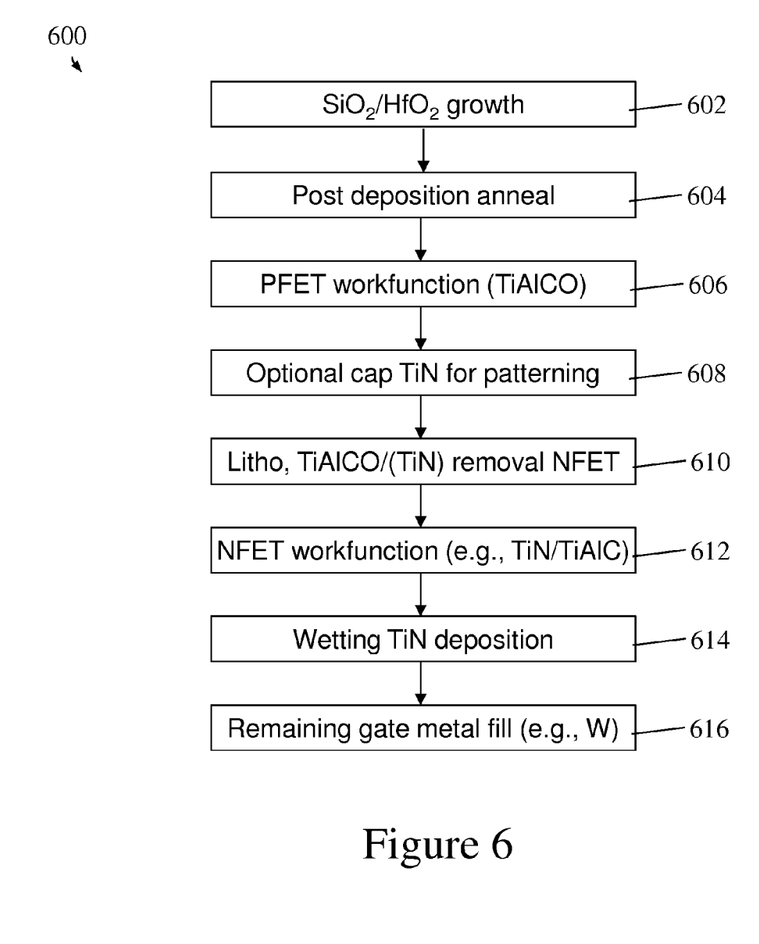
FIG. 6 is a flow diagram illustrating a method of forming a high-k gate stack for a CMOS device, in accordance with an embodiment of the invention.

As shown in FIG. 6, a first process flow 600 begins at block 602 with the formation of an interfacial layer and high-k layer (e.g., $SiO_2/HfO_2$) in an opening resulting from the removal of dummy gate material. This is also shown in FIG. 2 as described above. After an optional post deposition anneal in block 604, the process flow 600 proceeds to block 606 for deposition of the TiAlCO PFET workfunction metal layer (see also FIG. 3). In this embodiment, the TiAlCO is initially formed over both the PFET and NFET regions of the device. An optional TiN layer may also be formed over the TiAlCO PFET workfunction metal layer for patterning purposes, as shown in block 608.

In block 610, the device is lithographically patterned as known in the art to remove the TiAlCO PFET workfunction metal layer (and optional TiN layer) from NFET portions of the device. Thereafter, with the PFET portions of the device still protected, the NFET workfunction metal(s) are deposited as shown in block 612. Suitable NFET workfunction metals may include for example, TiN and TiAlC. Following the deposition of the NFET workfunction metal(s), a wetting TiN deposition may be used as shown in block 614 for adhesion of the subsequent gate metal fill in block 616 to the workfunction metal (see also FIG. 4).

Figure 7:
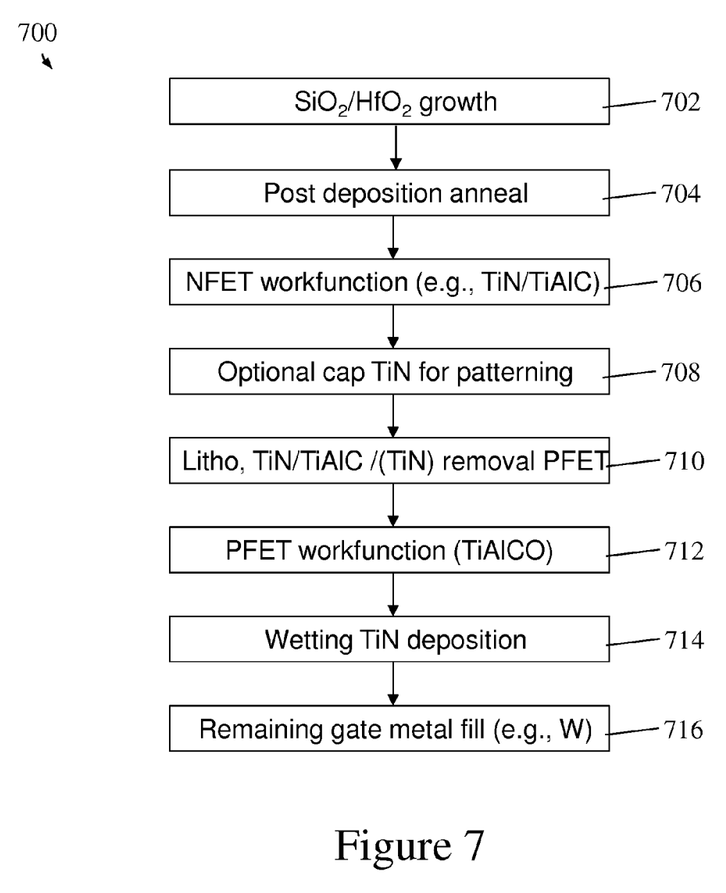
FIG. 7 is a flow diagram illustrating a method of forming a high-k gate stack for a CMOS device, in accordance with another embodiment of the invention.

Alternatively, in FIG. 7, a second process flow 700 begins at block 702 with the formation of an interfacial layer and high-k layer (e.g., $SiO_2/HfO_2$) in an opening resulting from the removal of dummy gate material. Again, this is also shown in FIG. 2 as described above. After an optional post deposition anneal in block 704, the process flow 700 proceeds to block 706 for deposition of the NFET workfunction metal layer(s) (e.g., TiN, TiAlC). In this embodiment, the NFET workfunction metal is initially formed over both the PFET and NFET regions of the device. An optional TiN layer may also be formed over the NFET workfunction metal layer for patterning purposes, as shown in block 708.

In block 710, the device is lithographically patterned as known in the art to remove the NFET workfunction metal layer (and optional TiN layer) from PFET portions of the device. Thereafter, with the NFET portions of the device still protected, the TiAlCO PFET workfunction metal layer is deposited as shown in block 712. Suitable Following the deposition of the PFET workfunction metal, a wetting TiN deposition may be used as shown in block 714 for adhesion of the subsequent gate metal fill in block 716 to the workfunction metal.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method comprising:
   forming an interfacial layer and a dielectric layer over portions of a substrate corresponding to removed dummy gate structures;
   forming a p-type field effect transistor (PFET) workfunction metal layer over the dielectric layer in a p-type field effect transistor (PFET) region of the substrate and in an n-type field effect transistor (NFET) region of the substrate, the workfunction metal layer comprising a titanium-aluminum-carbon-oxygen (TiAlCO) layer;
   removing the TiAlCO layer from the NFET region of the substrate;
   forming an NFET workfunction metal layer in the NFET region of the substrate; and forming a gate metal layer over the PFET workfunction metal layer, wherein the gate metal layer, the PFET workfunction metal layer, the dielectric layer, and the interfacial layer define a gate stack.

2. The method of claim 1, wherein the TiAlCO layer has an atomic concentration range of 10-20% for Ti, 10-20% for Al, 5-15% for C, and 45-75% for O.

3. The method of claim 1, wherein the workfunction metal layer is formed using atomic layer deposition (ALD).

4. The method of claim 1, wherein the TiAlCO layer is removed from the NFET region of the substrate by lithographical patterning.

5. The method of claim 4, further comprising:
forming a protective layer over the TiAlCO layer in the PFET region of the substrate.

6. The method of claim 5, wherein the protective layer is comprised of titanium nitride (TiN).

7. The method of claim 1, further comprising:
forming a protective layer over the TiAlCO layer in the PFET region of the substrate.

8. The method of claim 7, wherein the protective layer is comprised of titanium nitride (TiN).

9. The method of claim 1, further comprising:
forming a protective layer over the TiAlCO layer in the PFET region of the substrate and over the TiAlCO layer in the NFET region of the substrate; and
before the TiAlCO layer is removed from the NFET region of the substrate, removing the protective layer from the NFET region of the substrate.

10. The method of claim 9, wherein the protective layer is comprised of titanium nitride (TiN).

* * * * *